(12) United States Patent
Huang

(10) Patent No.: US 7,411,394 B2
(45) Date of Patent: Aug. 12, 2008

(54) METHOD FOR IMAGING DIFFUSION ANISOTROPY AND DIFFUSION GRADIENT SIMULTANEOUSLY

(75) Inventor: Jie Huang, Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 129 days.

(21) Appl. No.: 11/418,708

(22) Filed: May 5, 2006

(65) Prior Publication Data

US 2006/0261808 A1   Nov. 23, 2006

Related U.S. Application Data

(60) Provisional application No. 60/681,827, filed on May 17, 2005.

(51) Int. Cl.
*G01V 3/00* (2006.01)
(52) U.S. Cl. ...................................... 324/307
(58) Field of Classification Search ......... 324/300–322; 600/410–435
See application file for complete search history.

(56) References Cited

U.S. PATENT DOCUMENTS

| | | | |
|---|---|---|---|
| 5,825,186 A * | 10/1998 | Ehman et al. ............... | 324/309 |
| 6,163,152 A | 12/2000 | Bernstein et al. | |
| 6,992,484 B2 * | 1/2006 | Frank ......................... | 324/307 |
| 2003/0160612 A1 | 8/2003 | Yablonskiy et al. | |
| 2004/0113615 A1 | 6/2004 | Bammer et al. | |
| 2004/0140803 A1 | 7/2004 | Deimling | |
| 2004/0227510 A1 | 11/2004 | Rose et al. | |
| 2006/0001424 A1 | 1/2006 | Harvey et al. | |

OTHER PUBLICATIONS

Le Bihan, D. et al (1986). MR Imaging of Intravoxel Incoherent Motions: Application to Diffusion and Perfusion in Neurologic Disorders. Radiology 161:401-407.

Merboldt, K.D., et al (1985). Self-diffusion NMR imaging using stimulated echoes. J. Magn. Reson. 64:479-486.

Taylor, D.G. and Bushell, M.C. (1985). The spatial mapping of translational diffusion coefficients by the NMR imaging technique. Phys. Med Biol. 30, 345-349.

Stejskal, E.O. Use of Spin Echoes in a Pulsed Magnetic-FieldGradient to Study Anisotropic, Restricted Diffusion and Flow. J. Chem. Phys. 43:3597-3603, 1965.

Moseley, M.E., et al (1990). Diffusion-weightedMR imaging of acute stroke: correlation with T2-weighted and magnetic susceptibility-enhancedMR imaging in cats. AJNR 11, 423-429.

(Continued)

*Primary Examiner*—Brij Shrivastav
*Assistant Examiner*—Dixomara Vargas
(74) *Attorney, Agent, or Firm*—Ian C. McLeod

(57) ABSTRACT

Inhomogeneous tissue structures cause spatial-varying water molecule diffusion that is characterized by the spatial derivative of diffusivity, i.e., diffusion gradient. In a magnetic resonance imaging (MRI) system, the effects of diffusion and diffusion gradient are simultaneously encoded in an echo signal using diffusion-encoding magnetic field gradient pulses. A method for imaging the diffusion gradient of water molecules in tissues and for delineating the interface between two tissues having different diffusion properties is disclosed. The method also describes imaging diffusion anisotropy and diffusion gradient simultaneously without any additional scans in comparison with diffusion tensor MRI.

11 Claims, 12 Drawing Sheets
(2 of 12 Drawing Sheet(s) Filed in Color)

OTHER PUBLICATIONS

Basser et al. (1994). Estimation of the Effective Self-Diffusion Tensor from the NMR Spin Echo. Journal of Magnetic Resonance, Series B 103, 247-254.

GE Medical Systems. Signa Horizon LX Customer LX EPIC Software Reference Manual, 1997.

Ulug, A.M. et al. (1999). Orientation-Independent Diffusion Imaging Without Tensor Diagonalization: Anisotropy Definitions Based on Physical Attributes of the Diffusion Ellipsoid. Journal of Magnetic Resonance Imaging, 9:804-813.

Le Bihan, D. et al (2001) Diffusion Tensor Imaging:Concepts and Applications. J. Magn. Rson. Imaging 13:534-546.

* cited by examiner

FIGURE 4A
FIGURE 4B
b = 0
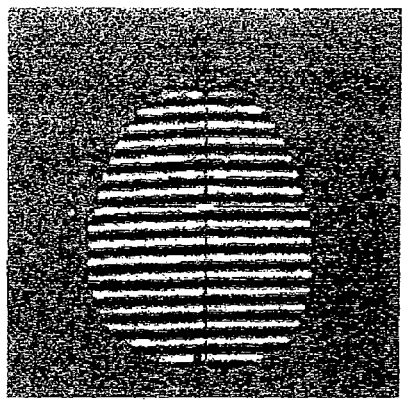 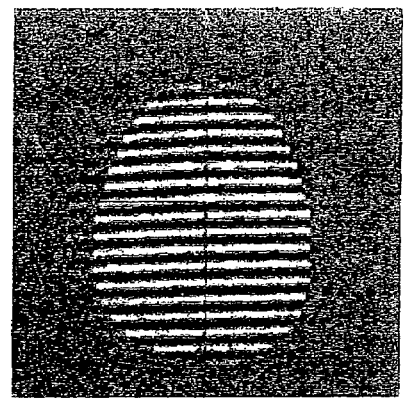
b = 4000
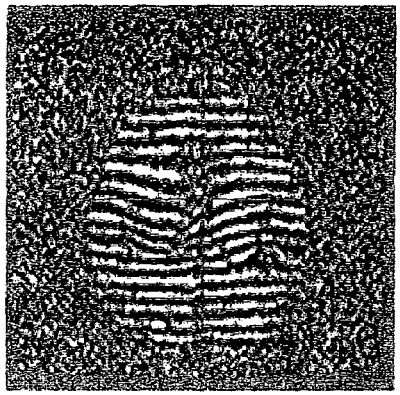 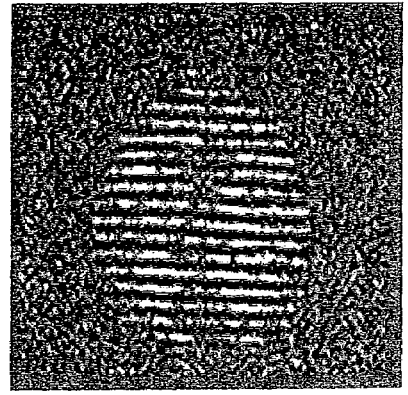
I images
Q images
FIGURE 4C
FIGURE 4D FIGURE 5A
FIGURE 5B
b = 0
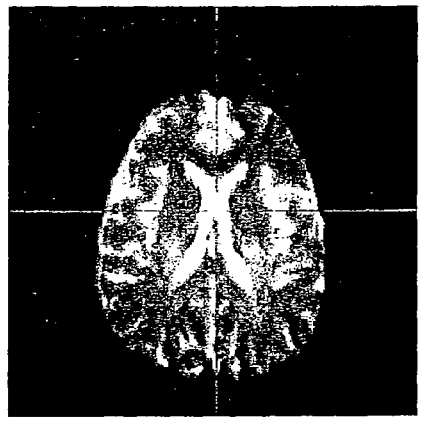
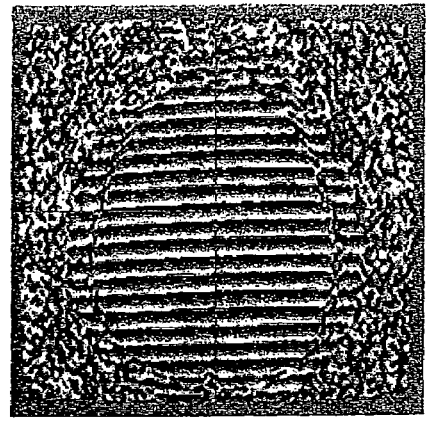
b = 4000
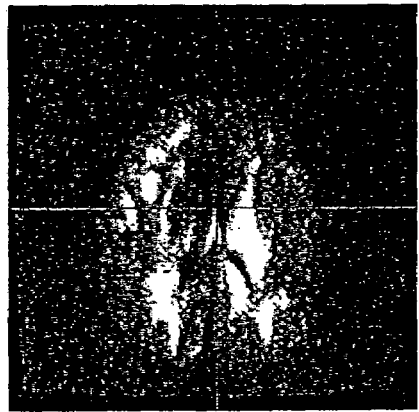
Magnitude images
Phase images
FIGURE 5C
FIGURE 5D

METHOD FOR IMAGING DIFFUSION ANISOTROPY AND DIFFUSION GRADIENT SIMULTANEOUSLY

CROSS-REFERENCE TO RELATED APPLICATIONS

This application relies for priority on U.S. Provisional Application No. 60/681,827, filed May 17, 2005.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION (1) Field of the Invention

The present invention relates to magnetic resonance imaging (MRI) methods, image display, and image processing for delineation of tissue structures and interfaces of the structures. More particularly, the invention relates to a method for measuring (a) diffusion gradient in tissues and (b) diffusion anisotropy and diffusion gradient simultaneously in tissues.

(2) Description of the Related Art

Any nucleus with a non-zero magnetic moment such as proton in water molecule tends to align itself with the direction of a magnetic field when placed in the field. The nucleus precesses around the field direction at a characteristic angular frequency (Larmor frequency $\omega$) which is dependent on the strength of the magnetic field ($B_0$) and on the properties of the specific nuclear species (the gyromagnetic ratio $\gamma$), e.g., $\omega = \gamma B_0$. Nuclei exhibiting such phenomena are referred to as spins.

In the presence of a static uniform magnetic field (polarizing field $B_0$), each individual magnetic moment of the spins in the tissue tends to align with the polarizing field, yielding a net magnetization parallel to the field (longitudinal magnetization). In the transverse plane to the field, however, the randomly oriented magnetic components of the spins cancel one another, producing no net magnetization perpendicular to the field.

By applying a transient magnetic field (excitation field $B_1$), the longitudinal magnetization may be rotated, or tipped, away from the polarizing field and the transverse component of the tipped magnetization precesses around the polarizing field at the Larmor frequency. The degree to which the longitudinal magnetization is tipped, and hence, the magnitude of the transverse magnetization depends primarily on the length of time and magnitude of the applied excitation field $B_1$. When the excitation field is terminated, the recovery of the longitudinal magnetization to its equilibrium value along the polarizing field is described by the spin-lattice relaxation process that is characterized by the time constant $T_1$. This recovery process is also referred to as the longitudinal relaxation process.

Once the excitation field is removed, precession of the transverse magnetization around the polarizing field may induce a sinusoidal signal in a receiving coil, and the frequency of the signal is the Larmor frequency. The net magnetization gradually reorients itself with the polarizing field when the excitation field is removed, resulting in the amplitude of the signal decaying exponentially with time. The rate at which the signal decays depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation field in a perfectly homogeneous field.

In order to produce a spatial image of a substance such as human tissue, magnetic field gradients are employed to obtain MRI signals from specific locations in the substance. Although the direction of the polarizing field remains the same, its strength varies along the x, y, and z axes oriented with respect to the substance. Varying the strength of the polarizing field linearly along one axis causes the Larmor frequency to vary linearly as a function of its position along the axis. Thus, by controlling the strength of these gradients during each MRI cycle, the spatial distribution of spin excitation can be controlled and the location of the MR signals can be identified. Then, the received spatial-encoded MR signals are digitized and processed to reconstruct the MR image using one of many well known reconstruction techniques.

MRI is a non-invasive modality for imaging the internal structures of the human body with no known health hazards attributed to its use. It is a routine clinical diagnostic imaging tool.

Diffusion-weighted MRI combines magnetic resonance imaging principles with the effects of molecular diffusion on MR signal in order to reveal diffusion characteristics of water molecules in tissues (Le Bihan, D. et al (1986). MR Imaging of Intravoxel Incoherent Motions: Application to Diffusion and Perfusion in Neurologic Disorders. Radiology 161:401-407; Merboldt, K. D., et al (1985). Self-diffusion NMR imaging using stimulated echoes. J. Magn. Reson. 64:479-486; and Taylor, D. G. and Bushell, M. C. (1985). The spatial mapping of translational diffusion coefficients by the NMR imaging technique. Phys. Med Biol. 30, 345-349)). Molecular diffusion refers to the random Brownian motion of molecules resulting from thermal agitation. During their random, diffusion-driven displacements molecules encounter various tissue components, i.e., macromolecules, intracellular organs, cell membranes, fibers, etc. These micrometer-sized cellular structures impede the molecular displacements. This diffusion effect of molecular displacements, due to the presence of the tissue microstructure, is encoded in the MR signal by using magnetic field gradient pulses (diffusion-encoding gradients). The observation of this displacement distribution provides unique information regarding the structure and geometric organization of tissues (Le Bihan, D. et al (1986). MR Imaging of Intravoxel Incoherent Motions: Applications to Diffusion and Perfusion in Neurologic Disorders. Radiology 161:401-407).

In diffusion-weighted MRI, the signal contrast is based on spin dephasing resulting in water molecule diffusion, and the rate of diffusion is measured by applying diffusion-encoding gradients. In comparison to free water diffusion, the diffusive motion of water molecules in tissue is influenced by the tissue microstructure. The degree of restriction that is encountered by water diffusion in a tissue is reflected in the diffusion coefficient or diffusivity, i.e., the stronger the restriction, the smaller the diffusivity. Water diffusion causes MR signal attenuation and provides a means for direct measurement of the diffusion coefficient, resulting in diffusion-weighted MRI (DWI).

Water diffusion-induced signal loss in a DWI image voxel results from the total contribution of all water molecules within the voxel. The overall effect observed in the voxel reflects, on a statistical basis, the displacement distribution of the water molecules present within this voxel. Thus, the measured diffusion coefficient is an apparent diffusion coefficient (ADC). This diffusion constant is estimated from the linear relationship between the logarithm of the echo intensity and the magnitude of the diffusion-encoding gradient in which ADC appears as a constant of proportionality (Stejskal, E. O. Use of Spin Echoes in a Pulsed Magnetic-Field Gradient to Study Anisotropic, Restricted Diffusion and Flow. J. Chem. Phys. 43:3597-3603).

The level of tissue microstructure restriction on water diffusion is reflected in relative changes in the ADC. In an acute stroke, the ADC in the ischemic territory was reduced by as much as 50% within minutes after the onset of ischemia, demonstrating the value of DWI for the early detection of stroke (Moseley, M. E., et al (1990). Diffusion-weighted MR imaging of acute stroke: correlation with T2-weighted and magnetic susceptibility-enhanced MR imaging in cats. AJNR 11, 423-429). The visualization of changes in the diffusion properties of tissue water with DWI has become a routine clinical tool to characterize tissue structure and to identify and differentiate disease processes.

Molecular diffusion is a three-dimensional process. In pure liquids such as water, individual molecules are in constant motion in every possible direction and have an equal probability of moving in every direction. Therefore, diffusion in pure liquids is isotropic. Water diffusion in biologic tissue along one particular direction, however, as selected by the direction of the probing magnetic field gradient, could be different from the diffusion along another direction due to the presence of various tissue components that restrict the Brownian motion in certain directions, rendering diffusion in structured tissues anisotropy. As diffusion is encoded in the MRI signal by using diffusion-encoding gradients, only molecular displacements that occur along the direction of the diffusion-encoding gradients are visible. Thus, diffusion anisotropy in structured tissues can be examined by observing variations in the diffusion measurements when the direction of the diffusion-encoding gradients is changed.

Diffusion anisotropy in structured tissues is reflected in the measured direction-dependent ADCs. Since these ADCs depend on the direction of the diffusion-encoding gradients and are exquisitely sensitive to the choice of the laboratory frame of reference, they provide only a qualitative description to diffusion anisotropy. To overcome this deficiency, a diffusion tensor is introduced to replace the diffusion coefficient (Basser, P J, et al. (1994). Estimation of the Effective Self-Diffusion Tensor from the NMR Spin Echo. Journal of Magnetic Resonance, Series B 103, 247-254). This technique is referred to as diffusion tensor MRI (DTI). With DTI, diffusion anisotropy effects can be fully extracted, characterized, and exploited. It provides quantitative parameters to characterize intrinsic features of tissue microstructure objectively. These parameters are independent of the direction of the diffusion-encoding gradients and of the choice of the laboratory frame of reference. A direct application of the DTI technique is the development of white matter fiber tractography (Basser, P J, et al. (2000). In Vivo Fiber Tractography Using DT-MRI Data. Magn Reson Med, 44: 625-632).

In summary, both DWI and DTI investigate water molecule diffusion with MRI. DWI examines the effect of diffusion on MRI signal in the direction of diffusion-encoding magnetic field gradients. DTI studies anisotropic diffusion, i.e., spatial-direction varied diffusion. DWI is a routine clinical tool. DTI has been invented in 1993 and has been widely used in both research and clinical today.

The diffusion tensor obtained with DTI determines the spatial-direction variation of diffusion within an MR image voxel, but it provides no information about intravoxel spatial-location variation of the diffusion. Inhomogeneous tissue structures yield diffusion varying from location to location. Intravoxel spatial-location related diffusion (diffusion gradient) has not been explored yet, neither theoretical nor experimentally. Within an MRI voxel, when diffusion is faster in one location than another location, it exhibits a spatial diffusion gradient between the two locations. For example, when diffusion is slower in the left half of a voxel than that in the right half, it produces a spatial gradient from left to right within the voxel. This diffusion gradient is characterized by the spatial derivative of diffusion coefficient. Since these diffusion gradients are caused by the inhomogeneous tissue structures, a measurement of the diffusion gradients with MRI will offer a noninvasive imaging tool for investigating intravoxel inhomogeneous tissue structures. In biologic tissues including very structural ones, intravoxel diffusion gradient in most places is not expected to be large except in the boundary of two structures having markedly different diffusion properties. The large gradient on the tissue interface and small gradients within the tissues could make a sharp contrast of the interface from the tissues, providing a quantity to delineate the interface precisely. Thus, if the diffusion gradient is measurable, it provides valuable information to elucidate intravoxel spatial-location variation of tissue structures.

The patent (U.S. Pat. No. 6,163,152 to Bernstein et al) presented a system and method for correcting systematic errors that occur in MR images due to magnetic gradient non-uniformity. In other words, the method improves the quality of MR images. The method has no relation with diffusion MRI though it can be applied to improve the quality of diffusion MR images. The application (U.S. application Ser. No. 2006/0001424 to Harvey et al) presented a method for MR imaging of at least a portion of a body placed in a stationary and substantially homogeneous main magnetic field. This method is related with DWI. The application (U.S. application Ser. No. 2004/0227510 to Rose et al) presented a method for eddy current compensated diffusion imaging. It corrects the eddy current artifact in DWI due to diffusion-encoding magnetic field gradient pulses. The application (U.S. application Ser. No. 2004/0113615 to Bammer et al) presented a mathematical framework for characterizing and then correcting the contribution of gradient non-uniformities to diffusion tensor imaging (DTI). In other words, the method improves the quality of DTI images. The application (U.S. application Ser. No. 2004/0140803 to Deimling) presented a specific pulse sequence (DESS) for DWI. The application (U.S. application Ser. No. 2003/0160612 to Yablonskiy et al) presented a specific method for DTI. The patents and applications are incorporated herein by reference in their entireties.

OBJECTS

It is an object of the present invention to provide a method for measuring diffusion gradient using an MRI system. It is further an object of the present invention to measure diffusion anisotropy and diffusion gradient simultaneously using an MRI system.

These and other objects will become increasingly apparent by reference to the following description and the drawings.

SUMMARY OF THE INVENTION

The present invention defines a relationship between the spatial derivative of diffusion coefficients (diffusion gradient)

and the MR signal in a spin-echo diffusion-weighted pulse sequence. Diffusion gradient is found to only depend on the phase of MR signal, independent of its magnitude attenuation. Thus, measuring the phase change of MR signal can be used to determine the diffusion gradient. This relationship establishes the basis for measuring the diffusion gradient. The relationship between the diffusion coefficient and the magnitude attenuation of MR signal is found to remain the same as in the DWI or DTI. Since MRI acquisition is capable of acquiring both phase and magnitude images within one scan, the present invention offers a method to measure diffusion anisotropy and diffusion gradient simultaneously. The implementation of these relationships resulted in the present invention.

The present invention provides a method for measuring diffusion gradient using DWI data. It also provides a method for measuring diffusion anisotropy and diffusion gradient simultaneously using DWI data without any additional scans in comparison with DTI.

The invention for measuring diffusion gradient acquires DWI data for reconstructing phase images. The difference between a phase image with a diffusion weighting and a phase image without any diffusion weighting is then used to compute the component of the diffusion gradient along the direction of the diffusion-encoding gradient pulses. By applying the diffusion-encoding gradient pulses in three orthogonal directions independently and separately, then the three components of the diffusion gradient can be computed. These components are used to construct a magnitude map for characterizing diffusion gradient. Diffusion gradient maps can be used to delineate tissue structures and interfaces of tissue structures.

The invention for simultaneously measuring diffusion anisotropy and diffusion gradient acquires DWI data for reconstructing phase and intensity images simultaneously without any additional scans in comparison with DTI. The phase images are used to compute the three components of the diffusion gradient, and then the components are used to construct a magnitude map for characterizing the diffusion gradient. The intensity images are used to compute the six components of diffusion tensor, and the obtained six components are then used to construct a map for characterizing diffusion anisotropy. Diagonalizing the diffusion tensor yields three eigenvalues and three corresponding eigenvectors. The spatial derivatives of the three principal diffusivities in the principal coordinate frame are then computed from the obtained three components of the diffusion gradient and the three eigenvectors. Diffusion anisotropy and diffusion gradient maps can be used to delineate tissue structures and interfaces of tissue structures. The spatial derivatives of the principal diffusivities can be utilized to improve white matter fiber tractograpy.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 4A to 4D depict diffusion-weighted I and Q images without diffusion-encoding gradient (b=0) and with diffusion-encoding gradient [b=4000 s/mm², direction (0.707, 0, 0.707)].

FIGS. 5A to 5D show diffusion-weighted magnitude and phase images based on I and Q images depicted in FIGS. 4A to 4D.

DESCRIPTION OF PREFERRED EMBODIMENTS

Before explaining the preferred embodiment of the present invention in detail, it is to be understood that the invention is not limited in its application to the details of the particular arrangement shown since the invention is capable of other embodiments. Also, the terminology used herein is for the purpose of description and not of limitation.

The invention provides a method for measuring the spatial derivatives of diffusion, i.e., diffusion gradients, with MRI. It investigates intravoxel spatial-location varied diffusion. The diffusion gradient-weighted MRI (DGWI) examines the effect of diffusion gradients on MRI signal. In contrast, DWI and DTI examine the effect of diffusion itself on MRI signal.

DGWI is independent of DWI and DTI. It can be used alone or combined with DWI and DTI. When it is used alone, it yields the first five claims of this invention. When it is combined with DTI, it yields the last six claims of the invention.

Figure 1:
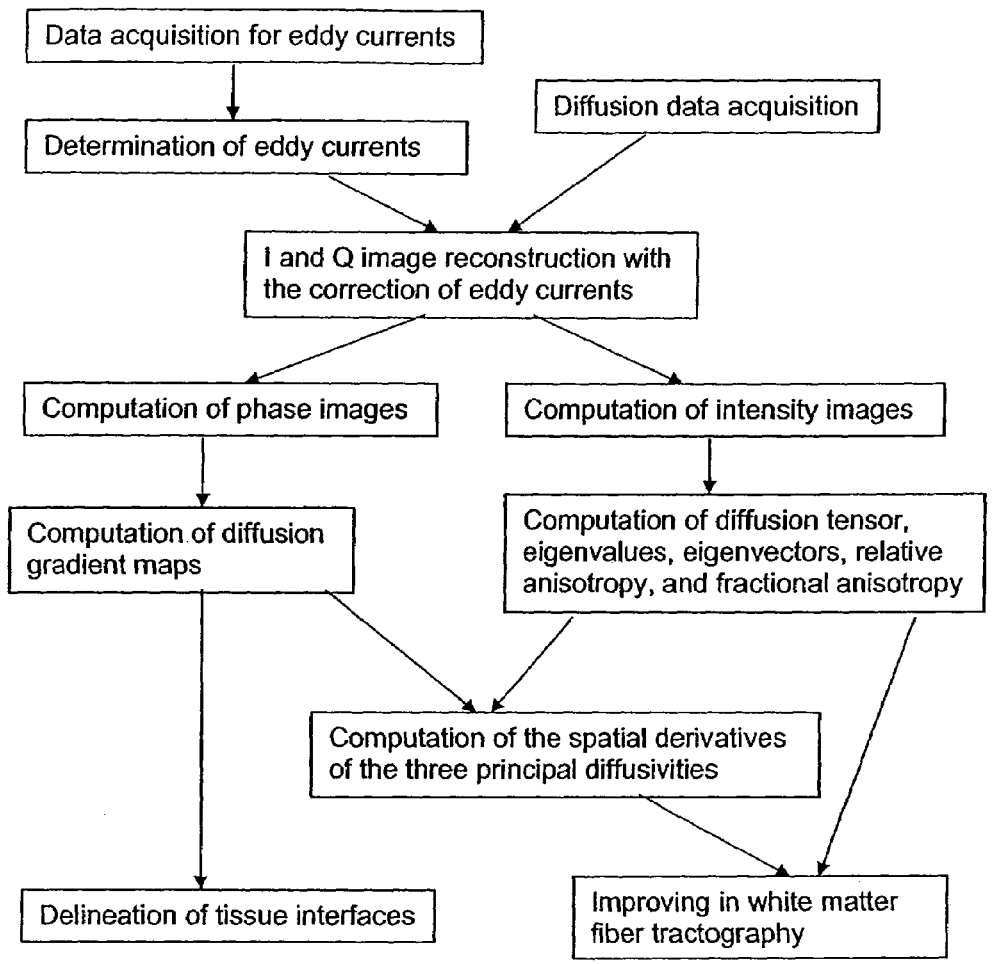
FIG. 1 is a flow chart of the method for simultaneously measuring diffusion anisotropy and diffusion gradient. Each component is described in DESCRIPTION OF THE PREFERRED EMBODIMENTS.
Figure 2:
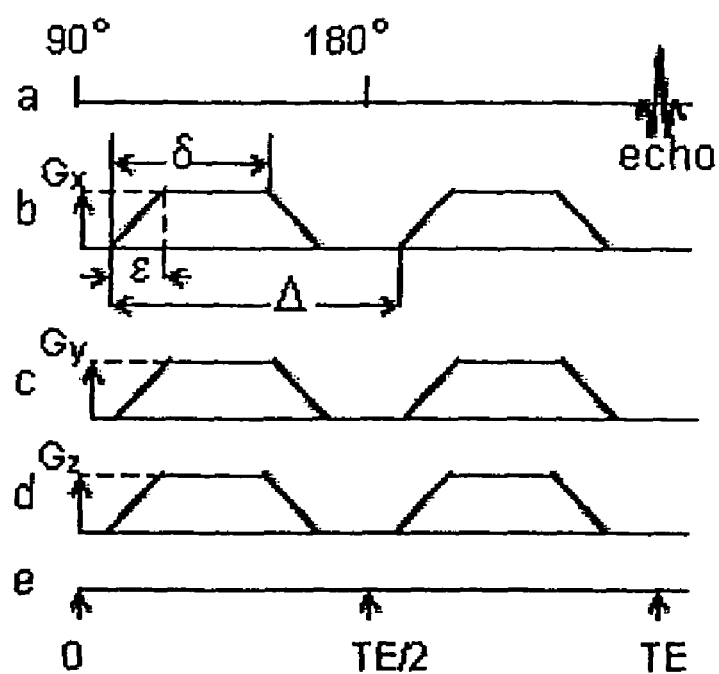
FIG. 2 illustrates a spin echo diffusion-encoding gradients pulse sequence: (a) the 90° and 180° RF pulses; diffusion-encoding magnetic field gradients applied in the (b) x, (c) y, and (d) z; (e) the time line, TE the echo time, δ the time between the initial rise of the trapezoidal pulse and the end of its plateau, Δ the time between the initial rise of the first and second pulses, and ε the rise time of the ramp. $G_i$ is the maximum diffusion-encoding field gradient along the $x_i$ coordinate direction. Diffusion effect is encoded with the dual gradients; one is placed prior to the 180° RF pulse and the other after it. MR signal was sampled during the echo period.

FIG. 2 illustrates a spin echo diffusion-encoding gradients pulse sequence. First, the 90° RF pulse tips the longitudinal magnetization $M_z$ into the transverse plane of the polarizing magnetic field $B_o$. Then, the first diffusion-encoding gradient is applied prior to the 180° rephasing RF pulse which is applied at the half echo time TE. After the rephasing pulse, the second diffusion-encoding gradient is applied. An echo signal is formed at TE, and the MR signal is sampled during the echo period.

The MR signal at the echo time TE relates to the diffusion tensor ($\overline{D}$) and the spatial derivative of the diffusion tensor ($\overline{K}$):

$$m(\vec{G}) = m(0) e^{i\vec{d}\cdot\vec{K} - \vec{b}\cdot\vec{D}} \quad (1)$$

where $m(\vec{G})$ is the echo MR signal in the presence of the diffusion-encoding magnetic field gradient $\vec{G}$, $m(0)$ the echo MR signal without diffusion-weighting ($\vec{G}=0$), $i \equiv \sqrt{-1}$, $\vec{d} \equiv -\gamma\delta\Delta\vec{G}$, or $d_i \equiv \gamma\delta\Delta G_i$, $\overline{K} \equiv \nabla\cdot\overline{D}$, or $$K_i \equiv \sum_{j=1}^{3} \frac{\partial D_{ji}}{\partial x_j},$$

and $$\vec{\vec{b}} \equiv \gamma^2 \left[ \delta^2 \left( \Delta - \frac{\delta}{3} \right) + \frac{\varepsilon^3}{30} - \frac{\delta\varepsilon^2}{6} \right] \vec{G}\vec{G},$$

or $$b_{ij} \equiv \gamma^2 \left[ \delta^2 \left( \Delta - \frac{\delta}{3} \right) + \frac{\varepsilon^3}{30} - \frac{\delta\varepsilon^2}{6} \right] G_i G_j.$$

In the absence of spatial variation of the diffusion tensor, i.e., $\overline{K}=0$, Eq. (1) is identical to the Eq. (10) in (Basser et al. (1994). Estimation of the Effective Self-Diffusion Tensor from the NMR Spin Echo. Journal of Magnetic Resonance, Series B 103, 247-254) which was used to estimate $\overline{D}$ in DTI. As can be seen from Eq. (1), $\overline{D}$ attenuates the echo intensity of the MR signal, but $\overline{K}$ causes a phase shift in the echo signal. Let A and $\phi$ be the echo intensity and phase of the MR signal, i.e., $m=Ae^{-\phi}$, respectively, we found that $$Ln\left[\frac{A(\vec{G})}{A(0)}\right] = -\sum_{i,j=1}^{3} b_{ij} D_{ji} \quad (2a)$$

$$\phi(\vec{G}) - \phi(0) = \sum_{i=1}^{3} d_i K_i \quad (2b)$$

where $$A(\vec{G}) = \sqrt{\text{Re}(m(\vec{G}))^2 + \text{Im}(m(\vec{G}))^2} \quad (3a)$$

and $$A(0) = \sqrt{\text{Re}(m(0))^2 + \text{Im}(m(0))^2},$$

$$\phi(\vec{G}) = \tan^{-1}\left(\frac{\text{Im}(m(\vec{G}))}{\text{Re}(m(\vec{G}))}\right) \quad (3b)$$

and $$\phi(0) = \tan^{-1}\left(\frac{\text{Im}(m(0))}{\text{Re}(m(0))}\right).$$

Here, Re and Im represent the real and imaginary part of the echo signal, respectively. Eqs. (2a) and (2b) show that $\overline{D}$ is determined from the echo intensity and $\overline{K}$ from the echo phase, respectively. Thus, they can be measured independently of each other. Since an MRI scan is capable of providing both intensity and phase images, Eqs. (2a) and (2b) also show that both $\overline{D}$ and $\overline{K}$ can be determined simultaneously, i.e., no additional scans are needed for determining $\overline{K}$. According to Eq. (2b), the phase shift, with and without a diffusion-encoding magnetic field gradient, determines the component of $\overline{K}$ in the direction of the diffusion-encoding magnetic field gradient.

Figure 3:
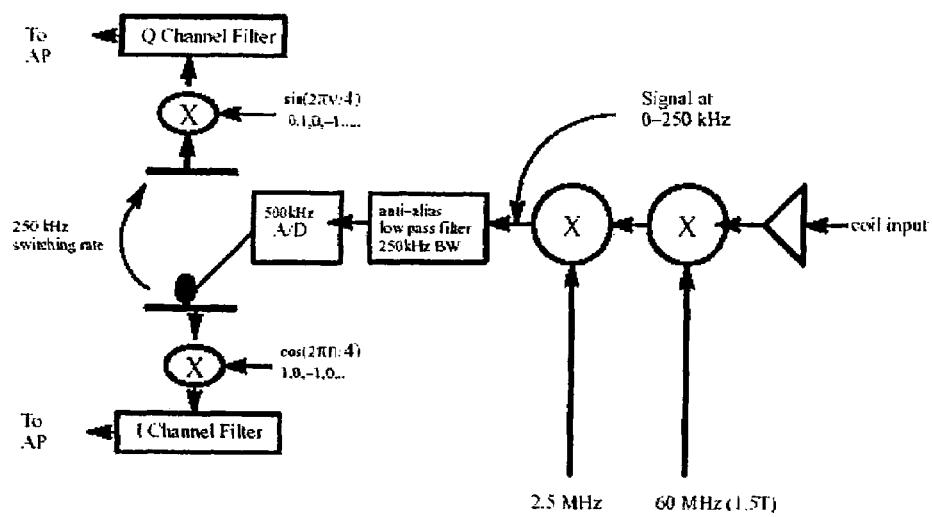
FIG. 3 shows the demodulation block diagram of a received MR signal to I and Q channel filtered signals (GE Medical Systems. Signa Horizon LX™ Customer LX EPIC Software Reference Manual). These I and Q signals are used to reconstruct I and Q images using a simple two-dimensional Fourier transformation.

The echo intensity and phase of the MR signal can be measured directly. FIG. 3 presents a demodulation block diagram of a GE MRI scanner (GE Medical Systems. Signa Horizon LX™ Customer LX EPIC Software Reference Manual). A received MR signal from a receiver coil is mixed with the receiver (RCVR) frequency to create an intermediate frequency signal at 0-250 kHz. An anti-alias filter immediately prior to the analog-to-digital (A/D) converter reduces the bandwidth of the signal to 250 kHz. The A/D converter has a 500 kHz fixed sampling rate. The sampled signal is then broken down digitally into inphase and quadrature (I/Q) components, which then enter separate inphase and quadrature digital filter paths, forming I and Q pairs for each data point. These I and Q values are used as input to the reconstruction 2D Fast Fourier Transform (FFT) processing. The output to the FFT are new, transformed I and Q images. FIGS. 4A to 4D show diffusion-weighted I and Q images without diffusion-encoding gradient (b=0) and with diffusion-encoding gradient (b=4000 s/mm²), acquired on a GE 3.0 T EXCITE scanner with a spin-echo diffusion-weighted echo-planar-imaging (EPI) pulse sequence (GE, HealthCare). Note the "zebra stripe" artifact presented in these images. This artifact was mainly caused by the diffusion-encoding gradient-induced magnetic field (eddy current) that shifted the center of the echo signal in the window of data acquisition.

The new I and Q values for each voxel in the I and Q images are the imaginary and real parts of the echo signal, respectively. The magnitude of these values ($A=\sqrt{Q^2+I^2}$) is taken to generate the magnitude or intensity image, and the phase image of the I and Q values is calculated by $\phi=\arctan(I/Q)$. FIGS. 5A to 5D show diffusion-weighted magnitude and phase images based on I and Q images depicted in FIGS. 4A to 4D. The "zebra stripe" artifact had no effect on the magnitude of MR signals, reflected in the stripe-free magnitude images in FIGS. 5A and 5C. However, the artifact still presented in the phase images as shown in the images in FIGS. 5B and 5D. The effect of diffusion gradient on phase of MR signals is illustrated by the differences presented in the phase image with b=4000 (FIG. 5D) in comparison to the phase image with b=0 (FIG. 5B), resulting in DGWI.

Like DWI which measures the effect of diffusion along the direction of diffusion-encoding magnetic field gradients, DGWI measures the effect of diffusion gradient along that direction. In DWI, the effect of diffusion along the direction of diffusion-encoding gradient $\overline{G}$ is reflected in the measured apparent diffusion coefficient D that is determined from the equation $Ln[A(\overline{G})/A(0)]=-bD$. Similarly, in DGWI, the effect of diffusion gradient along the direction of $\overline{G}$ is reflected in the measured apparent coefficient (K) of diffusion gradient that is determined by the equation $\phi(\overline{G})-\phi(0)=dK$. Thus, both D and K can be simultaneously measured. Unlike the determination of the symmetric tensor $\overline{D}$ that requires diffusion-encoding gradients being applied in at least six non-collinear directions plus one without applying any diffusion-encoding gradients, a complete determination of the vector $\overline{K}$ requires diffusion-encoding gradients being applied in only three orthogonal directions plus one without applying any diffusion-encoding gradients, and Eq. (2b) completely determine $\overline{K}$. Since its amplitude $K=\sqrt{K_x^2+K_y^2+K_z^2}$ is a scalar that is independent of the choice of coordinate system, it provides an index to signify the degree of diffusion gradient, resulting in a map of the diffusion gradient that is intrinsic to the tissue and independent of the orientation of the tissue in the magnet. To avoid the phase-wrapping problem associated with the phase calculation in Eq. (3b), the difference of the two phases in Eq. (3b) is computed by $$\phi(\overline{G})-\phi(0)=a\tan 2(A,B) \quad (4)$$

where $$A=Re(m(\overline{G}))*Im(m(0))-Re(m(0))*Im(m(\overline{G}))$$

$$B=Im(m(\overline{G}))*Im(m(0))+Re(m(\overline{G}))*Re(m(0)).$$

Figure 6:
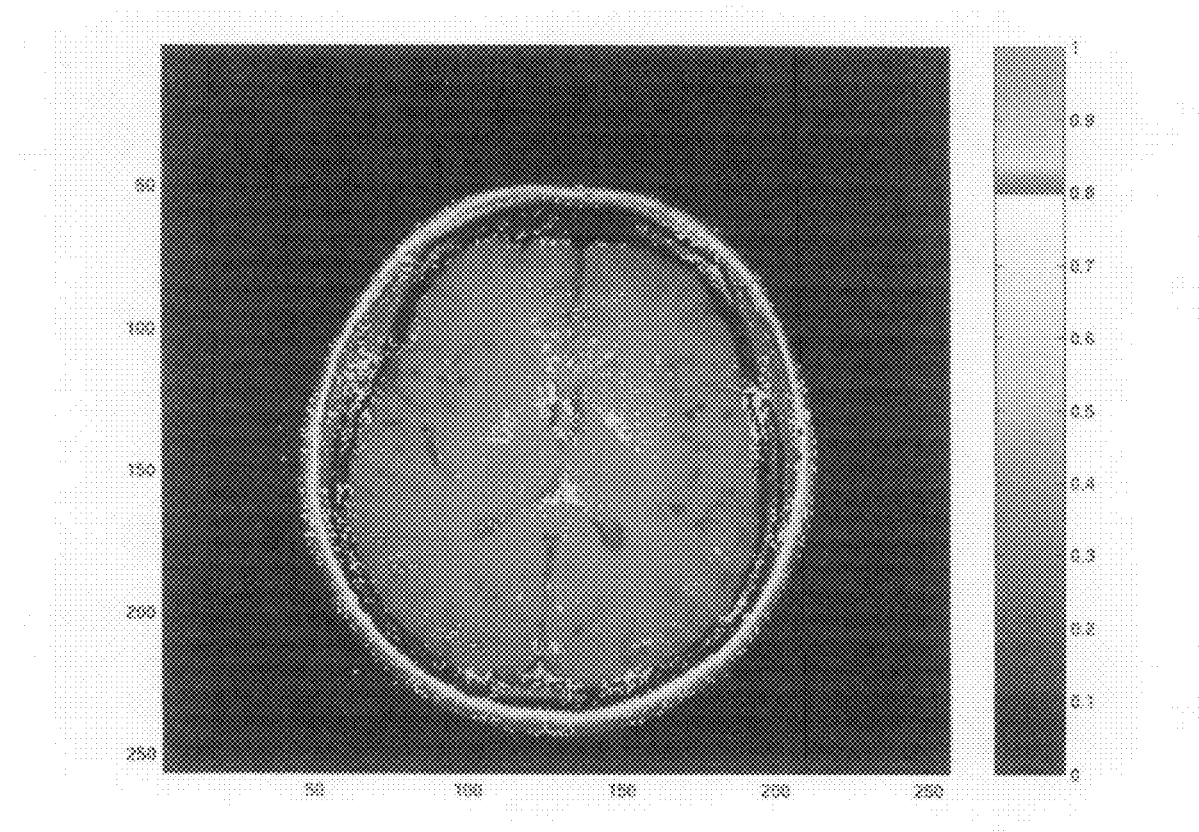
FIG. 6 shows a calculated diffusion gradient map overlaid on a T1-weighted image. The color indicates the magnitude of diffusion gradient.

FIG. 6 shows a magnitude diffusion gradient map overlaid on a T1-weighted image.

Both $\overline{D}$ and $\overline{K}$ can also be determined simultaneously. The diffusion tensor should be symmetric, i.e. $D_{ij}=D_{ji}$ for (i,j=x, y,z), and therefore, has only six (6) independent components. These six (6) independent components of $\overline{D}$ in Eq. (2a) and the three (3) components of $\overline{K}$ in Eq. (2b) can be simultaneously determined from the echo intensities and phase shifts of diffusion-weighted images encoded in six (6) non-collinear directions of the applied diffusion-encoding magnetic field gradients, along with an image acquired without diffusion-weighting (b=0) for A(0) and φ(0). Let X=[$x_1$ $x_2$ $x_3$ $x_4$ $x_5$ $x_6$]$^T$ and Y=[$y_1$ $y_2$ $y_3$ $y_4$ $y_5$ $y_6$]$^T$ be a 6×1 matrix that stores these six observations of the left side of Eq. (2a) and of Eq. (2b), respectively. We define a 6×1 matrix as α=[$D_{xx}$ $D_{yy}$ $D_{zz}$ $D_{xy}$ $D_{xz}$ $D_{yz}$]$^T$, which represents the six tensor components in Eq. (2a), and a 3×1 matrix as β=[$K_1$ $K_2$ $K_3$]$^T$, which represents the three (3) components of $\overline{K}$ in Eq. (2b), respectively. The method of least-squares regression can be used to yield the optimal estimations for both α and β:

$$\alpha_{opt}=(B^TB)^{-1}B^TX \quad (5a)$$

$$\beta_{opt}=(\Sigma^T\Sigma)^{-1}\Sigma^TY \quad (5b)$$

where B is a 6×6 matrix that is computed from the right side of Eq. (2a) and Σ a 6×3 matrix that is computed from the right side of Eq. (2b), respectively.

Figure 7:
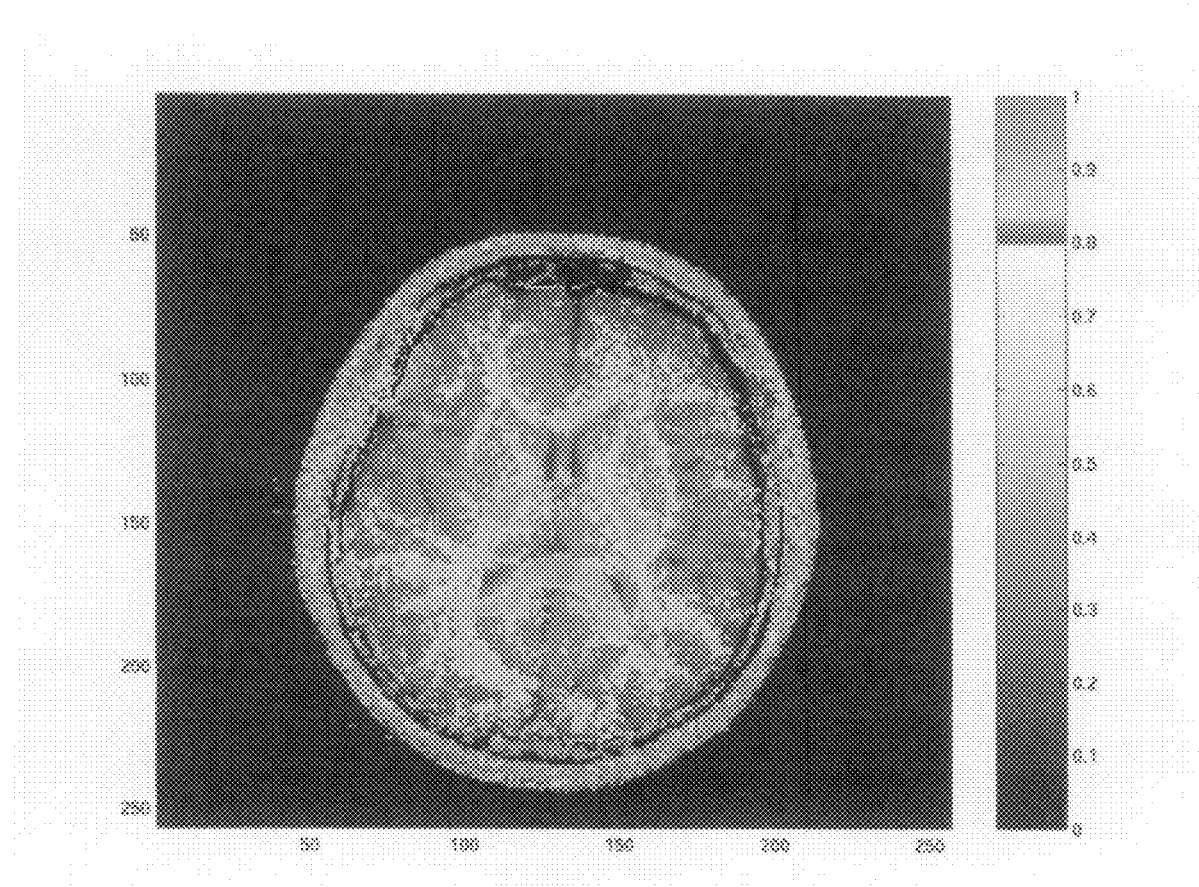
FIG. 7 shows a calculated diffusion anisotropy map overlaid on a T1-weighted image. The color indicates the magnitude of diffusion anisotropy.

To completely determine the six components of diffusion tensor, a minimum of six (6) independent diffusion-weighted measurements with six non-collinear magnetic fields gradients is required in addition to a measurement without diffusion-weighting. One (1) example is the following six non-collinear diffusion encoding directions (1/√2, 0, 1/√2); (−1/√2, 0, 1/√2); (0, 1/√2, 1/√2); (0, 1/√2−1/√2); (1/√2, 1/√2, 0); and (−1/√2, 1/√2, 0). The associated six measurements plus a measurement without diffusion-weighting can be used to determine diffusion tensor and diffusion gradient simultaneously with Eqs. (5a) and (5b). Similarly, the determined three components for diffusion gradient can be used to construct a magnitude map for diffusion gradient, as shown in FIG. 6. The determined six components for diffusion tensor can be used to construct orientation-independent diffusion anisotropy maps such as relative anisotropy and fractional anisotropy (Ulug, A. M. et al. (1999) Orientation-Independent Diffusion Imaging Without Tensor Diagonalization: Anisotropy Definitions Based on Physical Attributes of the Diffusion Ellipsoid. Journal of Magnetic Resonance Imaging, 9:804-813). FIG. 7 shows a fractional anisotropy map overlaid on a T1-weighted image.

The diagonalization of the diffusion tensor provides a simpler way to extract the diffusion anisotropy effects from the measured six independent components of the tensor (Basser, P. J. et al. (1994). Estimation of the Effective Self-Diffusion Tensor from the NMR Spin Echo. Journal of Magnetic Resonance, Series B 103, 247-254). In order to diagonalize the tensor $\overline{D}$, solving the characteristic equation of $\overline{D}$ is required:

$$|\overline{D}-\lambda\overline{I}|=0, \quad (6)$$

where $\overline{I}$ represents the isotropic identity tensor or the 3×3 unit matrix. The solution of Eq. (6) yields three eigenvalues $\lambda_i$ and three corresponding eigenvectors $\overline{\epsilon}_i$, satisfying the same set of matrix equations:

$$(\overline{D}-\lambda_i\overline{I})\overline{\epsilon}_i=0, (i=1,2,3). \quad (7)$$

Figure 8:
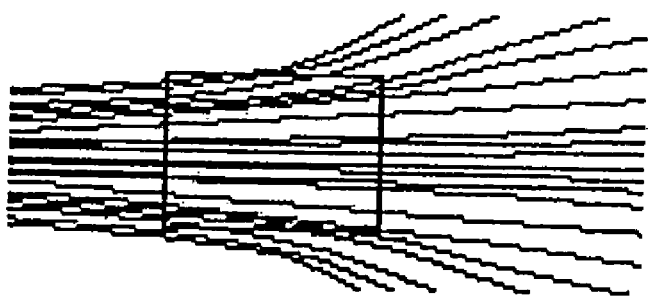
FIG. 8 illustrates the converging (left side) and diverging (right side) of white matter fibers with a rectangular box representing an image pixel.

The three (3) eigenvectors are orthogonal to each other, forming an orthogonal coordinate system. In this principal coordinate system (u,v,w), the diffusion tensor becomes diagonal. These three (3) orthonormal eigenvectors also form a rotation transformation from the laboratory coordinate system to the principal coordinate system. Applying this transformation to $\overline{K}=\overline{\nabla}\cdot\overline{D}$ yields $$\frac{\partial\lambda_i}{\partial u_i}=\sum_{j=1}^{3}\varepsilon_{ij}K_j \quad (8)$$

where the left side represents the spatial derivatives of the three (3) principal diffusivities in the principal coordinate frame. Equation (8) elucidates the physical meaning of the diffusion gradient $\overline{K}$. With the measured diffusion gradient $\overline{K}$ and the calculated eigenvectors $\overline{\epsilon}_i$, the spatial derivatives of the three (3) principal diffusivities in the principal coordinate frame can be computed according to Eq. (8). One (1) potential application of these spatial derivatives is the determination of convergence or divergence of white matter fibers as illustrated in FIG. 8. Within the selected voxel (the rectangular box in FIG. 8), white matter fibers converge on the left side and diverge on the right side, yielding a horizontal diffusion gradient along the fiber direction. The associated spatial derivative of the main eigenvalue along the fiber direction could determine the converging and diverging side of the fibers.

The diffusion-encoding gradient-induced artifacts in phase images (FIGS. 5B and 5D) can be removed by measuring the eddy current induced magnetic fields within the window of data acquisition and then correcting the field-induced phase errors during image reconstruction. The eddy current induces a time-varying magnetic field, $$\overline{B}_{EC}(t)=[\epsilon_0(t)+G_x(t)x+G_y(t)y+G_z(t)z]\hat{B}_0 \quad (9)$$

where $\hat{B}_0$ represents the unit vector of the main field. When a spatially symmetric uniform phantom is placed at the center of the magnet with all phase- and frequency-encoding gradients turned off, assuming that the slice-selection is the y-axis, the signal acquired at time t with the diffusion-encoding gradients in an arbitrary direction is given by $$S_{on}(y_0,t)=S_0\exp[i\phi_{on}(y_0,t)] \quad (10a),$$

$$\phi_{on}(y_0,t)=-\gamma\int[\epsilon_0(t')+G_y(t')]dt'+\Phi_{off}(y_0,t) \quad (10b)$$

where $\Phi_{off}(y_0,t)$ represents the cumulated phase with the diffusion-encoding gradients turned off. Thus, the phase difference between with and without the diffusion-encoding gradients turned on is $$\Delta\phi_{on}(y_0,t)=\phi_0(t)+y_0\phi_y(t) \quad (11)$$

where $\phi_0(t)=-\gamma\int\epsilon_0(t')dt'$ and $\phi_y(t)=-\gamma\int G_y(t')dt'$. Based on the measurements at two slice positions $y_1$ and $y_2$, the following can be obtained:

$$\phi_0(t)=[y_2\Delta\phi_{on}(y_1,t)-y_1\Delta\phi_{on}(y_2,t)]/(y_2-y_1) \quad (12a),$$

$$\phi_y(t)=[\Delta\phi_{on}(y_1,t)-\Delta\phi_{on}(y_2,t)]/(y_1-y_2) \quad (12b).$$

Optimal estimations for $\phi_0(t)$ and $\phi_y(t)$ can be obtained by a polynomial or exponential curve fitting of the measured $\phi_0(t)$ and $\phi_y(t)$, respectively. With these estimations, both $\epsilon_0(t)$ and $G_y(t)$ can be computed for each time point in the acquisition window, and similarly, $G_x(t)$ and $G_z(t)$. The effect due to $\overline{B}_{EC}(t)$ in Eq. (9) can potentially be removed in image reconstruction.

Figure 9:
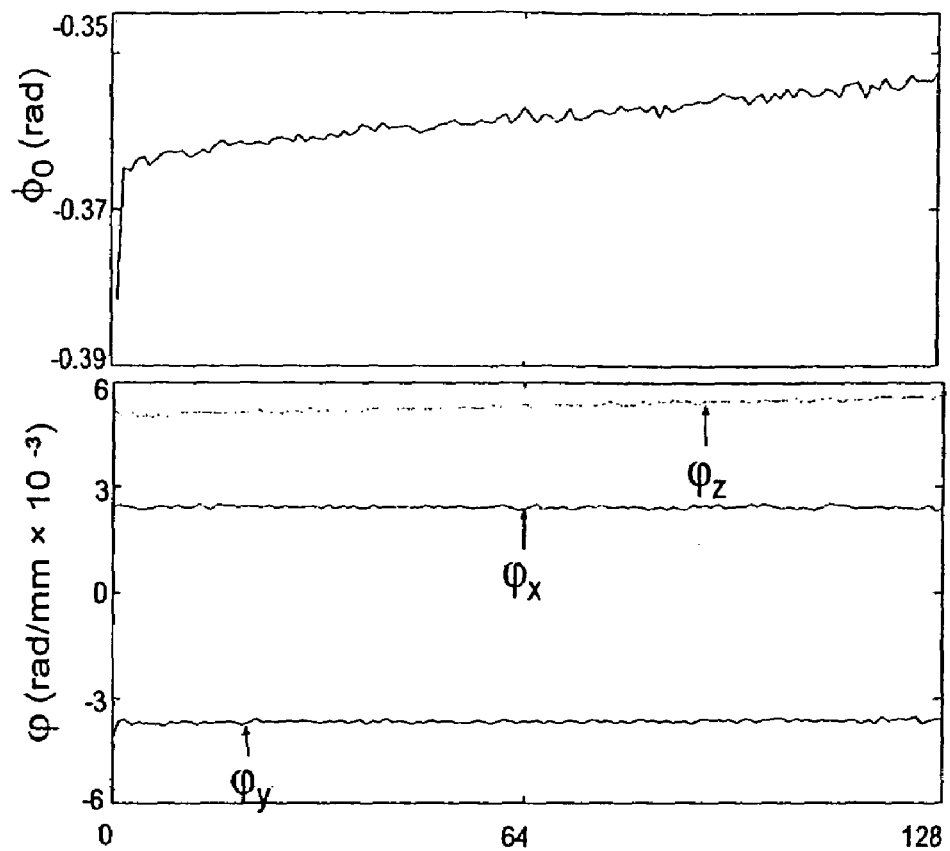
FIG. 9 shows the measured eddy current terms in the acquisition window with the diffusion-encoding gradient in the superior/inferior direction.
Figure 10:
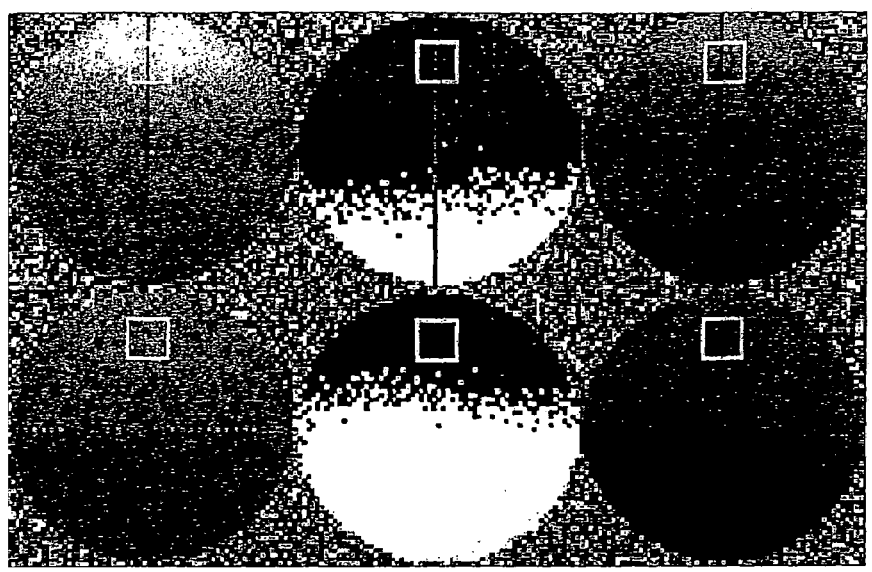
FIG. 10 shows the phase images of the two slices without diffusion-encoding gradients (left column), their corresponding phase images with the diffusion-encoding gradient (middle column), and the eddy current corrected phase images (right column).
Figure 11:
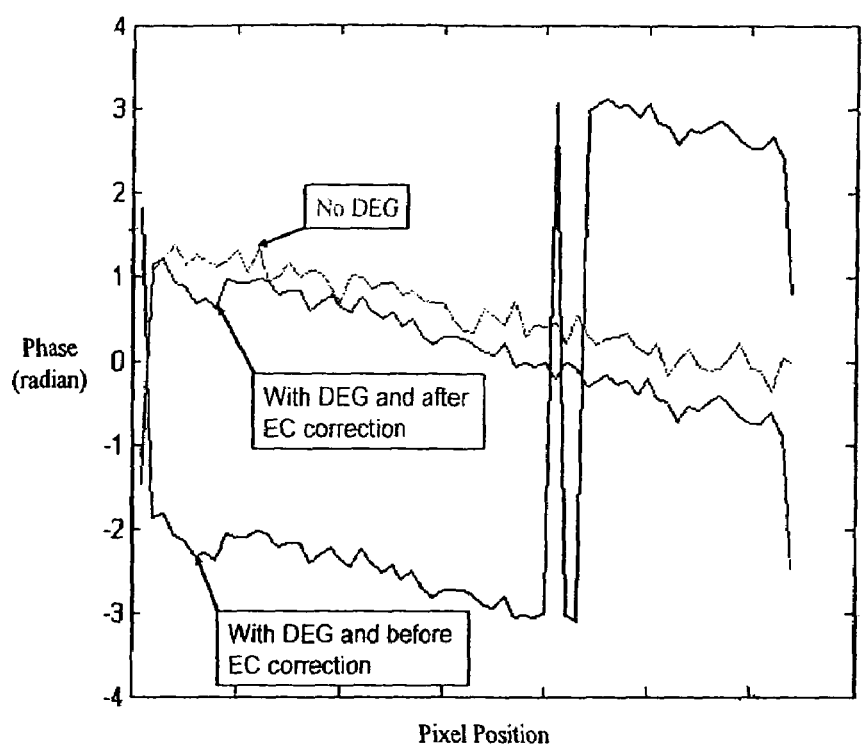
FIG. 11 shows phase values of the three colored lines in FIG. 10. DEG: diffusion-encoding gradient; EC: eddy current.

FIG. 9 shows the measured four terms of $\phi_0(t)$, $\phi_x(t)$, $\phi_y(t)$, and $\phi_z(t)$ in the acquisition window with the diffusion-encoding gradients in the superior/inferior direction. The data was acquired on a GE 3.0 T EXCITE scanner with a modified spin echo diffusion-weighted pulse sequence and a dimethyl silicone spherical phantom. Two (2) slices with equal distance (11.5 mm) from the center of the magnet were selected on each of the three axes with FOV=200 mm, matrix size 128× 128, TE/TR=100/1000ms, slice thickness 3 mm, b=86 (s/mm$^2$), and d=1.73 (s·radian/mm). FIG. 10 shows the phase images of the two slices without diffusion-encoding gradients (left column), their corresponding phase images with the diffusion-encoding gradients (middle column), and the eddy current corrected phase images (right column). Only the cumulated effect due to the spatially invariant eddy current term was corrected in the right column in FIG. 10. The eddy current term caused an overall phase shift as illustrated in FIG. 11. For the selected ROI (yellow box) in FIG. 10, the phase values are 1.09±0.14 (mean ±sd), −2.21±0.13, and 0.80±0.13 rad, respectively for the top panel, and are 0.70±0.13, −2.68±0.15, and 0.32±0.15 rad, respectively for the bottom panel.

Figures 12A, 12B:
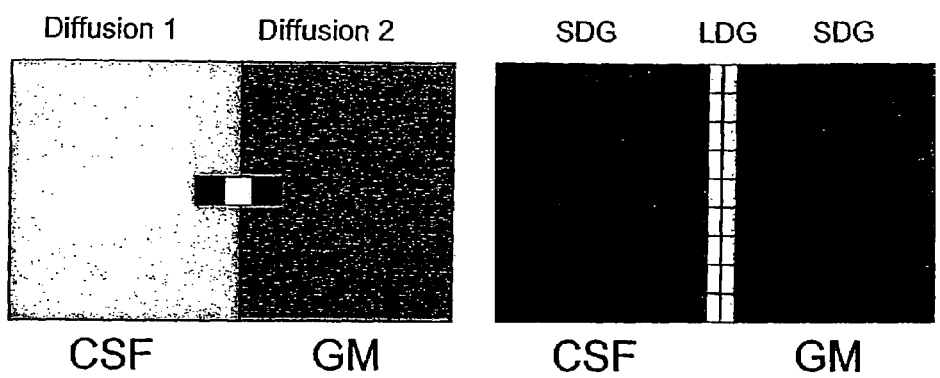
FIGS. 12A and 12B illustrate the delineation of the interface between cerebrospinal fluid (CSF) and gray matter (GM) with diffusion gradient-weighted MRI. Water molecule diffusion within CSF (Diffusion 1) is different than that within GM (Diffusion 2) as illustrated in FIG. 12A. This difference in diffusion yields a large horizontal diffusion gradient within the white pixel on the interface. In contrast, diffusion within both the CSF and the GM is approximately homogeneous, and therefore the diffusion gradient within both the CSF and the GM is expected to be small, represented by the two black pixels on the left and right side of the white pixel. In comparison to the small diffusion gradient within both the CSF and the GM, the large diffusion gradient on the interface forms a sharp contrast in a diffusion gradient-weighted MRI as illustrated by the white pixels in FIG. 12B. The link of these white pixels draws a line which delineates the boundary between the CSF and the GM. SDG: small diffusion gradient; LDG: large diffusion gradient.

FIGS. 12A and 12B illustrate the delineation of the interface between two (2) tissues of different diffusion with DGWI. As an Example, we consider cerebrospinal fluid (CSF) and gray matter (GM) as a target interface for delineation. The measured mean diffusivity is 3.19×10$^{-3}$ (mm$^2$/s) for CSF and 0.83×10$^{-3}$ (mm$^2$/S) for GM (Le Bihan, D. et al (2001) Diffusion Tensor Imaging: Concepts and Applications. J. Magn. Reson. Imaging 2001; 13:534-546). For simplicity, we assume the direction of $\overline{G}$ is perpendicular to the interface. We also assume that the voxel on the interface equally covers the CSF and GM, i.e., a half of the voxel covers the CSF and the other half covers the GM, as illustrated by the white pixel in FIG. 12A. When the voxel size across the interface is 0.16 mm, the averaged distance between the CSF and the GM is 0.08 mm which yields an estimated magnitude of 29.5×10$^{-3}$ mm/s for $\overline{K}$. When we choose Δ=55 ms, δ=40 ms, and G=1.5 (g/cm) with TE=100 ms in the diffusion-encoding spin-echo pulse sequence (FIG. 2), we have b≈1077 (s/mm$^2$) and d=504(degree·s/mm). With this d value, the diffusion gradient across the interface causes a fifteen-degree phase change to the phase signal of MRI. In contrast, diffusion in both CSF and GM are expected to be relatively homogeneous, resulting in almost negligible diffusion gradients within the CSF and the GM. Thus, phase changes within both CSF and GM are expected to be very small and close to zero in comparison to the large fifteen-degree phase change across the interface. The link of these voxels with large phase changes draws a line which delineates the boundary between the CSF and the GM as illustrated by the white pixels in FIG. 12B.

It is intended that the foregoing description be only illustrative of the present invention and that the present invention be limited only by the hereinafter appended claims.

I claim:

1. A method for measuring intravoxel molecule diffusion gradient of spins in a specimen in a selected direction using an MRI system which comprises:
   (a) utilizing diffusion-encoding magnetic gradient pulses in an MRI pulse sequence to encode diffusion into MR signals;
   (b) applying diffusion-encoding gradient pulses in a selected direction to yield diffusion-weighted MR signals;
   (c) applying no diffusion-encoding gradient pulses to yield MR signals without diffusion-weighting;
   (d) demodulating the received MR signals to I and Q channel filtered signals;
   (e) reconstructing I and Q images from the I and Q signals using a simple two-dimensional Fourier transformation;
   (f) computing diffusion-weighted and diffusion-free phase images from their corresponding I and Q images;
   (g) computing the phase difference between the diffusion-weighted phase image and the phase image without any diffusion-weighting; and
   (h) computing the intravoxel diffusion gradient along the direction of the diffusion-encoding gradient pulses from the phase difference with a display of images of the measured intravoxel molecule diffusion gradient in the MRI system.

2. The method for measuring diffusion gradient of claim 1 with eddy current correction using the MRI system which comprises:
   (a) measuring eddy current terms in the acquisition window for the diffusion-encoding gradient pulses in claim 1(b);
   (b) correcting eddy current artifacts during the image reconstruction for I and Q images in claim 1 (e); and
   (c) computing the intravoxel diffusion gradient of claim 1 with eddy current correction using the same steps of (f), (g), and (h) in claim 1.

3. The method for measuring the magnitude of diffusion gradient of claim 2 using the MRI system which comprises:
   (a) applying the diffusion-encoding gradient pulses in claim 1 (b) in three orthogonal directions independently and separately;

(b) computing the component of the diffusion gradient in each of the three directions using all three steps in claim 2; and (c) computing a magnitude map for the diffusion gradient from the three components.

4. The method for characterizing tissue structures by utilizing the diffusion gradient magnitude map of claim 3.

5. The method for delineating interfaces of tissue structures by utilizing the diffusion gradient magnitude map of claim 3.

6. A method for measuring diffusion anisotropy and diffusion gradient simultaneously using an MRI system which provides a display of images of intravoxel molecule diffusion gradient which comprises:

(a) applying the diffusion-encoding gradient pulses in six non-collinear directions independently and separately to yield diffusion-weighted MR signals for the six directions;

(b) not applying any diffusion-encoding gradient pulses to yield MR signals without diffusion-weighting;

(c) demodulating the received MR signals to I and Q channel filtered signals;

(d) measuring the corresponding eddy current terms in the acquisition window for each of the six diffusion-encoding gradient pulses in (a);

(e) reconstructing I and Q images with eddy current correction from the I and Q signals using a simple two-dimensional Fourier transformation;

(f) computing six diffusion-weighted and one diffusion-free phase images from their corresponding I and Q images;

(g) computing the three components of diffusion gradient from the six diffusion-weighted phase images plus the phase image without diffusion-weighting;

(h) computing six diffusion-weighted and one diffusion-free intensity images from their corresponding I and Q images; and (i) computing the six components of diffusion tensor from the six diffusion-weighted intensity images plus the intensity image without diffusion-weighting.

7. The method for measuring diffusion anisotropy and diffusion gradient simultaneously of claim 6 which further comprises:

(a) computing a magnitude map for diffusion gradient from the three components of diffusion gradient obtained in claim 6 (g) with a display of a first image of the intravoxel molecule diffusion gradient in the MRI system; and (b) computing anisotropic maps from the six components of diffusion tensor obtained in claim 6 (i) with a display of a second image of the intravoxel molecule diffusion anisotropy in the MRI system.

8. A method for characterizing tissue structures by utilizing diffusion gradient and diffusion anisotropy maps of claim 7.

9. A method for delineating interfaces of tissue structures by utilizing diffusion gradient and diffusion anisotropy maps of claim 7.

10. The method for measuring diffusion anisotropy and diffusion gradient simultaneously of claim 6 which further comprises:

(a) diagonalizing the diffusion tensor obtained in claim 6 (i) to yield three eigenvalues and three corresponding eigenvectors for the tensor; and (b) computing the spatial derivatives of the three principal diffusivities in the principal coordinate frame from the three components of the diffusion gradient obtained in claim 6 (g) and the three eigenvectors.

11. A method for improving white matter fiber tractography by utilizing the spatial derivatives of the three principal diffusivities of claim 10.

* * * * *

UNITED STATES PATENT AND TRADEMARK OFFICE
CERTIFICATE OF CORRECTION

PATENT NO. : 7,411,394 B2
APPLICATION NO. : 11/418708
DATED : August 12, 2008
INVENTOR(S) : Jie Huang It is certified that error appears in the above-identified patent and that said Letters Patent is hereby corrected as shown below:

Column 7, line 25, "$(\overline{D})$" should be -- $(\vec{D})$ --.

Column 7, line 26, "$(\overline{K})$" should be -- $(\vec{K})$ --.

Column 7, line 30, "$(\overline{G})$" should be -- $(\vec{G})$ --.

Column 7, line 31, " $\overline{G}$ " should be -- $\vec{G}$ --.

Column 7, line 32, " $(\overline{G}=0)$ " should be -- $(\vec{G}=0)$ --.

Column 7, line 33, " $\overline{d} \equiv \gamma\delta\Delta\overline{G}$ " should be -- $\vec{d} \equiv \gamma\delta\Delta\vec{G}$ --.

Column 7, line 33, " $\overline{K} \equiv \nabla \cdot \overline{D}$ " should be -- $\vec{K} \equiv \nabla \cdot \vec{D}$ --.

Column 7, line 51, " $\overline{K}$ " should be -- $\vec{K}$ --.

Column 7, line 54, " $\overline{D}$ " should be -- $\vec{D}$ --.

Column 7, line 55, " $\overline{D}$ " should be -- $\vec{D}$ --.

Column 7, line 56, " $\overline{K}$ " should be -- $\vec{K}$ --.

Column 8, line 19, " $\overline{D}$ " should be -- $\vec{D}$ --.

Column 8, line 20, " $\overline{K}$ " should be -- $\vec{K}$ --.

Column 8, line 24, " $\overline{D}$ and $\overline{K}$ " should be -- $\vec{D}$ and $\vec{K}$ --.

Column 8, line 25, " $\overline{K}$ " should be -- $\vec{K}$ --.

Column 8, line 28, " $\overline{K}$ " should be -- $\vec{K}$ --.

Column 9, line 8, " $\overline{G}$ " should be -- $\vec{G}$ --.

Column 9, line 10, " $(\overline{G})$ " should be -- $(\vec{G})$ --.

Column 9, line 11, " $\overline{G}$ " should be -- $\vec{G}$ --.

Column 9, line 13, " $(\overline{G})$ " should be -- $(\vec{G})$ --.

Signed and Sealed this
Eighth Day of November, 2011

David J. Kappos
*Director of the United States Patent and Trademark Office*

CERTIFICATE OF CORRECTION (continued)
U.S. Pat. No. 7,411,394 B2

Column 9, line 15, " $\overline{D}$ " should be -- $\vec{D}$ --.

Column 9, line 19, " $\overline{K}$ " should be -- $\vec{K}$ --.

Column 9, line 22, " $\overline{K}$ " should be -- $\vec{K}$ --.

Column 9, lines 30-36, " $\phi(\overline{G}) - \phi(0) = a\tan 2(A, B)$ where
$A = \text{Re}(m(\overline{G})) * \text{Im}(m(0)) - \text{Re}(m(0)) * \text{Im}(m(\overline{G}))$
$B = \text{Im}(m(\overline{G})) * \text{Im}(m(0)) + \text{Re}(m(\overline{G})) * \text{Re}(m(0)).$ "

should be -- $\phi(\vec{G}) - \phi(0) = a\tan 2(A, B)$
$A = \text{Re}(m(\vec{G})) * \text{Im}(m(0)) - \text{Re}(m(0)) * \text{Im}(m(\vec{G}))$
where
$B = \text{Im}(m(\vec{G})) * \text{Im}(m(0)) + \text{Re}(m(\vec{G})) * \text{Re}(m(0)).$ --.

Column 9, line 40, " $\overline{D}$ and $\overline{K}$ " should be -- $\vec{D}$ and $\vec{K}$ --.

Column 9, line 43, " $\overline{D}$ " should be -- $\vec{D}$ --.

Column 9, line 44, " $\overline{K}$ " should be -- $\vec{K}$ --.

Column 9, line 55, " $\overline{K}$ " should be -- $\vec{K}$ --.

Column 10, line 26, " $\overline{D}$, solving the characteristic equation of $\overline{D}$ should be -- $\vec{D}$, solving the characteristic equation of $\vec{D}$ --.

Column 10, lines 27-28, " $|\overline{D} - \lambda \overline{I}| = 0,$ " should be -- $|\vec{D} - \lambda \vec{I}| = 0,$ --.

Column 10, line 29, " $\overline{I}$ " should be -- $\vec{I}$ --.

Column 10, line 31, " $\overline{\varepsilon}_i$ " should be -- $\vec{\varepsilon}_i$ --.

Column 10, lines 33-34, " $(\overline{D} - \lambda_i \overline{I})\overline{\varepsilon}_i = 0, \quad (i=1,2,3).$ " should be -- $(\vec{D} - \lambda_i \vec{I})\vec{\varepsilon}_i = 0, \quad (i=1,2,3).$ --.

Column 10, line 41, " $\overline{K} = \nabla \cdot \overline{D}$ " should be -- $\vec{K} = \nabla \cdot \vec{D}$ --.

Column 10, line 52, " $\overline{K}$. With the measured diffusion gradient $\overline{K}$ " should be -- $\vec{K}$. With the measured diffusion gradient $\vec{K}$ --.

Column 10, line 53, " $\overline{\varepsilon}_i$ " should be -- $\vec{\varepsilon}_i$ --.

Column 11, line 4, " $\overline{B}$ " should be -- $\vec{B}$ --.

Column 11, line 14, " $\phi_{on}(y_0, t) = -\gamma \int [\varepsilon_0(t') + G_y(t')]dt' + \Phi_{off}(y_0, t),$ " should be -- $\phi_{on}(y_0, t) = -\gamma \int_0 [\varepsilon_0(t') + G_y(t')]dt' + \Phi_{off}(y_0, t)$ --.

Column 11, line 20, " $\Delta\phi_{on}(y_0, t) = \phi_0(t) + y_0\phi_y(t)$ " should be -- $\Delta\phi_{on}(y_0, t) = \phi_0(t) + y_0\varphi_y(t)$ --.

CERTIFICATE OF CORRECTION (continued)
U.S. Pat. No. 7,411,394 B2

Column 11, line 22, "$\phi_0(t) = -\gamma \int \varepsilon_0(t')dt'$ and $\phi_y(t) = -\gamma \int G_y(t')dt'$" should be
-- $\phi_0(t) = -\gamma \int_0 \varepsilon_0(t')dt'$ and $\varphi_y(t) = -\gamma \int_0 G_y(t')dt'$ --.

Column 11, line 27, "$\phi_y(t) = [\Delta\phi_{on}(y_1,t) - \Delta\phi_{on}(y_2,t)]/(y_1 - y_2)$" should be
-- $\varphi_y(t) = [\Delta\phi_{on}(y_1,t) - \Delta\phi_{on}(y_2,t)]/(y_1 - y_2)$ --.

Column 11, line 29, "$\phi_y(t)$" should be -- $\varphi_y(t)$ --.

Column 11, line 31, "$\phi_y(t)$" should be -- $\varphi_y(t)$ --.

Column 11, line 34, "$\overline{B}$" should be -- $\vec{B}$ --.

Column 11, lines 36-37, "$\phi_0(t)$, $\phi_x(t)$, $\phi_y(t)$, and $\phi_z(t)$" should be
-- $\phi_0(t)$, $\varphi_x(t)$, $\varphi_y(t)$, and $\varphi_z(t)$ --.

Column 11, line 63, "(mm$^2$/S)" should be -- (mm$^2$/s) --.

Column 11, line 66, "$\overline{G}$" should be -- $\vec{G}$ --.

Column 12, line 6, "$\overline{K}$" should be -- $\vec{K}$ --.